United States Patent
Franklin et al.

(10) Patent No.: US 10,127,108 B2
(45) Date of Patent: *Nov. 13, 2018

(54) PRECOMPUTED REDUNDANCY CODE MATRICES FOR HIGH-AVAILABILITY DATA STORAGE

(71) Applicant: Amazon Technologies, Inc., Seattle, WA (US)

(72) Inventors: Paul David Franklin, Seattle, WA (US); Bryan James Donlan, Seattle, WA (US); Colin Laird Lazier, Seattle, WA (US); Claire Elizabeth Suver, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 1 day.

This patent is subject to a terminal disclaimer.

(21) Appl. No.: 15/350,946

(22) Filed: Nov. 14, 2016

(65) Prior Publication Data

US 2017/0060687 A1 Mar. 2, 2017

Related U.S. Application Data

(63) Continuation of application No. 14/675,471, filed on Mar. 31, 2015, now Pat. No. 9,495,249.

(51) Int. Cl.
| | |
|---|---|
| *G06F 11/00* | (2006.01) |
| *G06F 11/10* | (2006.01) |
| *G06F 11/16* | (2006.01) |
| *G06F 3/06* | (2006.01) |
| *H03M 13/00* | (2006.01) |
| *H03M 13/15* | (2006.01) |

(52) U.S. Cl.
CPC .......... *G06F 11/1076* (2013.01); *G06F 3/064* (2013.01); *G06F 3/067* (2013.01); *G06F 3/0619* (2013.01); *G06F 11/1088* (2013.01); *G06F 11/167* (2013.01); *H03M 13/616* (2013.01); *G06F 2211/104* (2013.01); *G06F 2211/1028* (2013.01); *H03M 13/154* (2013.01); *H03M 13/1515* (2013.01)

(58) Field of Classification Search
CPC .................................................. G06F 11/1076
USPC ........................................................ 714/6.24
See application file for complete search history.

(56) References Cited

U.S. PATENT DOCUMENTS

| | | | | |
|---|---|---|---|---|
| 2014/0047040 | A1* | 2/2014 | Patiejunas | ............... H04L 51/24 709/206 |
| 2015/0278324 | A1* | 10/2015 | Wong | ................ G06F 17/30575 707/634 |
| 2016/0041887 | A1* | 2/2016 | Davis | .................. G06F 11/1612 714/6.2 |

* cited by examiner

*Primary Examiner* — Sarai E Butler
(74) *Attorney, Agent, or Firm* — Davis Wright Tremaine LLP

(57) ABSTRACT

Techniques described and suggested herein include systems and methods for precomputing regeneration information for data archives ("archives") that have been processed and stored using redundancy coding techniques. For example, regeneration information, such as redundancy code-related matrices (such as inverted matrices based on, e.g., a generator matrix for the selected redundancy code) corresponding to subsets of the shards, is computed for each subset and, in some embodiments, stored for use in the event that one or more shards becomes unavailable, e.g., so as to more efficiently and/or quickly regenerate a replacement shard.

20 Claims, 8 Drawing Sheets

PRECOMPUTED REDUNDANCY CODE MATRICES FOR HIGH-AVAILABILITY DATA STORAGE

CROSS REFERENCE TO RELATED APPLICATIONS

This application is a continuation of pending U.S. patent application Ser. No. 14/675,471, filed on Mar. 31, 2015, entitled "PRECOMPUTED REDUNDANCY CODE MATRICES FOR HIGH-AVAILABILITY DATA STORAGE," the content of which is incorporated by reference herein in its entirety.

BACKGROUND

The use of network computing and storage has proliferated in recent years. The resources for network computing and storage are often provided by computing resource providers who leverage large-scale networks of computers, servers and storage drives to enable clients, including content providers, online merchants and the like, to host and execute a variety of applications and web services. Content providers and online merchants, who traditionally used on-site servers and storage equipment to host their websites and store and stream content to their customers, often forego on-site hosting and storage and turn to using the resources of the computing resource providers. The usage of network computing allows content providers and online merchants, among others, to efficiently and to adaptively satisfy their computing needs, whereby the computing and storage resources used by the content providers and online merchants are added or removed from a large pool provided by a computing resource provider as need and depending on their needs.

The proliferation of network computing and storage, as well as the attendant increase in the number of entities dependent on network computing and storage, has increased the importance of optimizing data performance and integrity on network computing and storage systems. Data archival systems and services, for example, may use various types of error correcting and error tolerance schemes, such as the implementation of redundancy coding and data sharding. Furthermore, capacity and cost of persisting increasing quantities of data may be mitigated by the use of data storage devices or media that is considerably faster at sequential storage than random access storage, relative to other data storage devices.

BRIEF DESCRIPTION OF THE DRAWINGS

Various embodiments in accordance with the present disclosure will be described with reference to the drawings, in which.

DETAILED DESCRIPTION

Figure 1:
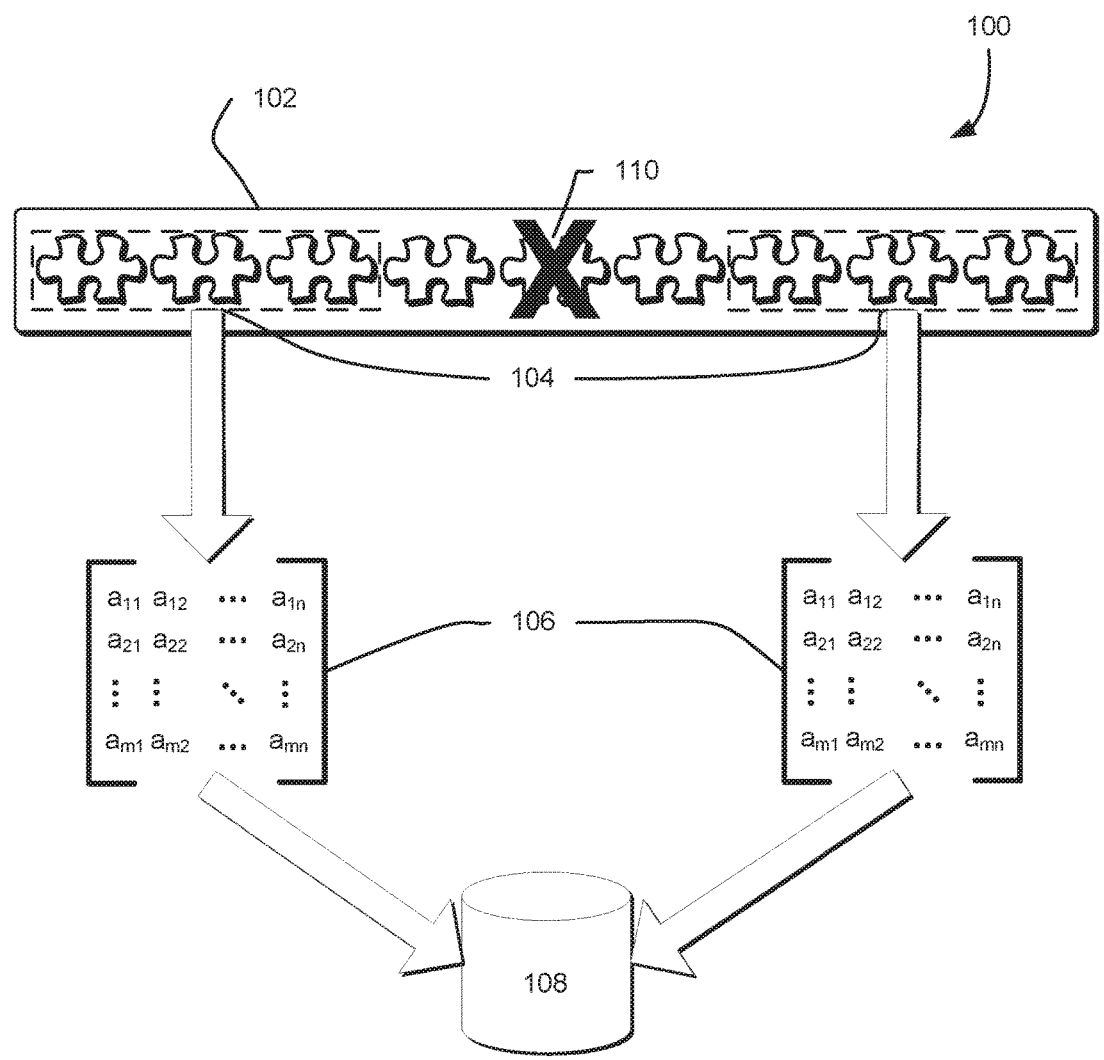
FIG. 1 schematically illustrates an environment in which precomputed redundancy coding matrices for subsets of redundancy coded data, such as shards, are generated, in accordance with some embodiments.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Techniques described and suggested herein include systems and methods for precomputing regeneration information for data archives ("archives") that have been processed and stored using redundancy coding techniques. For example, redundancy codes, such as erasure codes, may be applied to incoming archives (such as those received from a customer of a computing resource service provider implementing the storage techniques described herein) to generate encoded shards, so as to improve availability, durability, and other characteristics of archives so encoded and stored. Regeneration information, such as redundancy code-related matrices (such as inverted matrices based on, e.g., a generator matrix for the selected redundancy code) corresponding to subsets of the shards, is computed for each subset and, in some embodiments, stored for use in the event that one or more shards becomes unavailable (e.g., so as to more efficiently and/or quickly regenerate a replacement shard).

For example, precomputation of regeneration information may be used to increase the durability of redundancy coded data stored as a plurality of shards, especially when one or more failure scenarios (e.g., one or more shards becoming unavailable) can be predicted prior to their presumptive occurrence. As an example, regeneration information may be precomputed for a failure-correlated scenario, such as a given facility responsible for storing a subset of the shards going offline, such that the regeneration information is calculated for remaining shards in some or all such failure-correlated scenarios that could occur. Accordingly, in this example, if one of the failure-correlated scenarios for which the regeneration information was precomputed occurs, the unavailable shards (and the data encoded therein) may be regenerated more quickly and effectively than if such regeneration information was not precomputed.

One or more parameters associated with an implemented redundancy code may be assessed by an implementing system when determining and/or selecting the makeup of the regeneration sets. For example, a given regeneration set may include only the number of shards equal to the minimum quorum necessary to regenerate the original data of the archive, based on the selected redundancy code. As another example, the quantity of regeneration sets and specific constituency of each of the regeneration sets may be determined such that every shard of a given set of shards (e.g., corresponding to a data object, volume, archive, etc.) may be regenerated by one or more of the regeneration sets formed therefrom.

Once the configuration of the regeneration sets is determined, regeneration information, such as redundancy code-related matrices, may be generated for each determined regeneration set. Such regeneration information may include matrices inverted from a portion of a generator matrix (e.g., a submatrix of the generator matrix) specific to the member shards of a given regeneration set (e.g., with columns irrelevant to the regeneration set removed from the generator matrix). As may be contemplated, precomputing such regeneration information prior to when such information is emergently necessary, e.g., to regenerate unavailable shards, may decrease the amount of computational load and/or time necessary to generate a replacement shard, relative to if such regeneration information was not precomputed.

In some embodiments, the precomputation of regeneration information may be performed in connection with initialization of a system or application configured to access a given archive or other set of data stored on a system implementing redundancy coding and other techniques described herein. As another example, the precomputation of regeneration information may occur dynamically in response to the detection of an event where improved resiliency, availability, or durability of data may be beneficial, or in response to an event where the integrity or availability of data may be compromised. For example, if a given set of shards is stored on a system that experiences a partial outage, assuming the remaining number of shards is equal to or greater than the minimum quorum necessary to reconstruct the stored data, regeneration sets may be determined and associated regeneration information is precomputed so as to more quickly react to additional shards becoming unavailable.

FIG. 1 schematically illustrates an environment in which precomputed redundancy coding matrices for subsets of redundancy coded data, such as shards, are generated, in accordance with some embodiments. A set of shards 102 corresponding to data of one or more archives is stored on or in connection with a data storage device or data storage system implementing a redundancy code, in accordance with some embodiments. The shards may correspond to data received from, e.g., client entities (such as those associated with a customer of a computing resource service provider as described in further detail herein), for encoding and storage on or in connection with the data storage system.

The data storage system may communicate with such client entities using any appropriate method, including through programmatic methods (e.g., application programming interfaces, web service calls, etc.), through user interfaces, and the like. The client entities may be any entity capable of transacting data with a data storage system, such as over a network (including the Internet). Examples include physical computing systems (e.g., servers, desktop computers, laptop computers, thin clients, and handheld devices such as smartphones and tablets), virtual computing systems (e.g., as may be provided by the computing resource service provider using one or more resources associated therewith), services (e.g., such as those connecting to the data storage system via application programming interface calls, web service calls, or other programmatic methods), and the like.

The data storage system may be any computing resource or collection of such resources capable of processing data for storage, and interfacing with one or more resources to cause the storage of the processed data. Examples include physical computing systems (e.g., servers, desktop computers, laptop computers, thin clients, and handheld devices such as smartphones and tablets), virtual computing systems (e.g., as may be provided by the computing resource service provider using one or more resources associated therewith), services (e.g., such as those connecting to the data storage system via application programming interface calls, web service calls, or other programmatic methods), and the like. In some embodiments, the resources of the data storage system, as well as the data storage system itself, may be one or more resources of a computing resource service provider, such as that described in further detail below. In some embodiments, the data storage system and/or the computing resource service provider provides one or more archival storage services and/or data storage services, such as those described in further below, through which the client entities may transact data such as the archives.

The archives may include any quantity of data in any format. For example, the archives may be single files, or, in some embodiments, may include several files. The archives may be encrypted by, e.g., the client device(s), or, in some embodiments, may be encrypted by a component of the data storage system after receipt of the archives, such as on the request of a customer of the data storage system and/or the computing resource service provider.

The shard set 102, as mentioned, may represent a redundancy-coded form of data corresponding to one or more archives. The redundancy code may be applied, e.g., by a data storage system as described herein. The original data of the archives may be encoded using the redundancy code so as to generate a quantity of shards in the set according to the specific redundancy code utilized, the parameters of the selected redundancy code, and/or desired characteristics for the stored data (e.g., level of durability, availability, performance, redundancy, and the like). Such encoded information may be any mathematically computed information derived from the original data, and depends on the specific redundancy code applied. As mentioned, the redundancy code may include erasure codes (such as online codes, Luby transform codes, raptor codes, parity codes, Reed-Solomon codes, Cauchy codes, Erasure Resilient Systematic Codes, regenerating codes, or maximum distance separable codes) or other forward error correction codes. In some embodiments, the redundancy code may implement a generator matrix that implements mathematical functions to generate multiple encoded objects correlated with the original data to which the redundancy code is applied.

One or more regeneration sets 104, each associated with a subset of the shard set 104, are selected for further processing in accordance with techniques discussed in further detail herein. The regeneration sets 104 may be selected such that each regeneration set 104 includes a number of shards of the shard set 102 corresponding a minimum quorum of such shards required reconstruct the original data of the archive(s)/data represented therewith. A plurality of regeneration sets 104 may be selected, such that every shard of the shard set 102 is capable of being regenerated using at least one of the regeneration sets 104.

By way of example, two regeneration sets 104 are illustrated. Each depicted regeneration set 104 includes three shards of the shard set 102, which corresponds to the minimum quorum of shards necessary to regenerate the original data encoded in the shard set 102. Mathematically, by selecting two such regeneration sets 104, any shard in the shard set 102 may be regenerable by at least one of the selected regeneration sets 104. For example, if the depicted shard 110 becomes unavailable, both of the regeneration sets 104 remain whole and thus still contain the quorum necessary to regenerate the original data (and subsequently replace the shard 110). However, if one of the shards in one of the regeneration sets 104 becomes unavailable, while that regeneration set 104 may no longer contain the requisite quorum, the other remains whole and thus capable of regenerating the original data and thus the shard.

To facilitate this process, matrices 106 may be precomputed from the respective regeneration sets 104. Such matrices 106 may be precomputed to be specific to the respective regeneration sets 104, such that they may be stored, e.g., on a data store 108, for future retrieval. The data store 108 may be any entity capable of storing data. For example, the data store 108 may be a physical data storage server or device, a virtual computing system or device (such as one provided by the computing resource service provider as described herein), a database, a cache (such as a least-recently used cache), a queue, or a service (e.g., programmatic and/or web service) that provides such storage capabilities, whether for short-term or long-term storage. The data store 108 may store data persistently, transiently, or some combination thereof.

The matrices 106 may be the matrix inverse of the calculated matrix for the specific quorum of shards in the associated regeneration set 104. As may be contemplated, as the number of shards in the shard set 102 and the size of the minimum quorum increases, the computational requirements for generating the matrices 106 may greatly increase (and, in many cases, may be greater than further calculations necessary to regenerate the original data and/or encode a replacement shard therefrom). As a result, precomputing such regeneration information (e.g., determining the regeneration sets 104 and computing the matrices 106) prior to an event when such regeneration is necessitated may decrease the amount of time and system load required to generate replacement shards for those that become unavailable.

Figure 2:
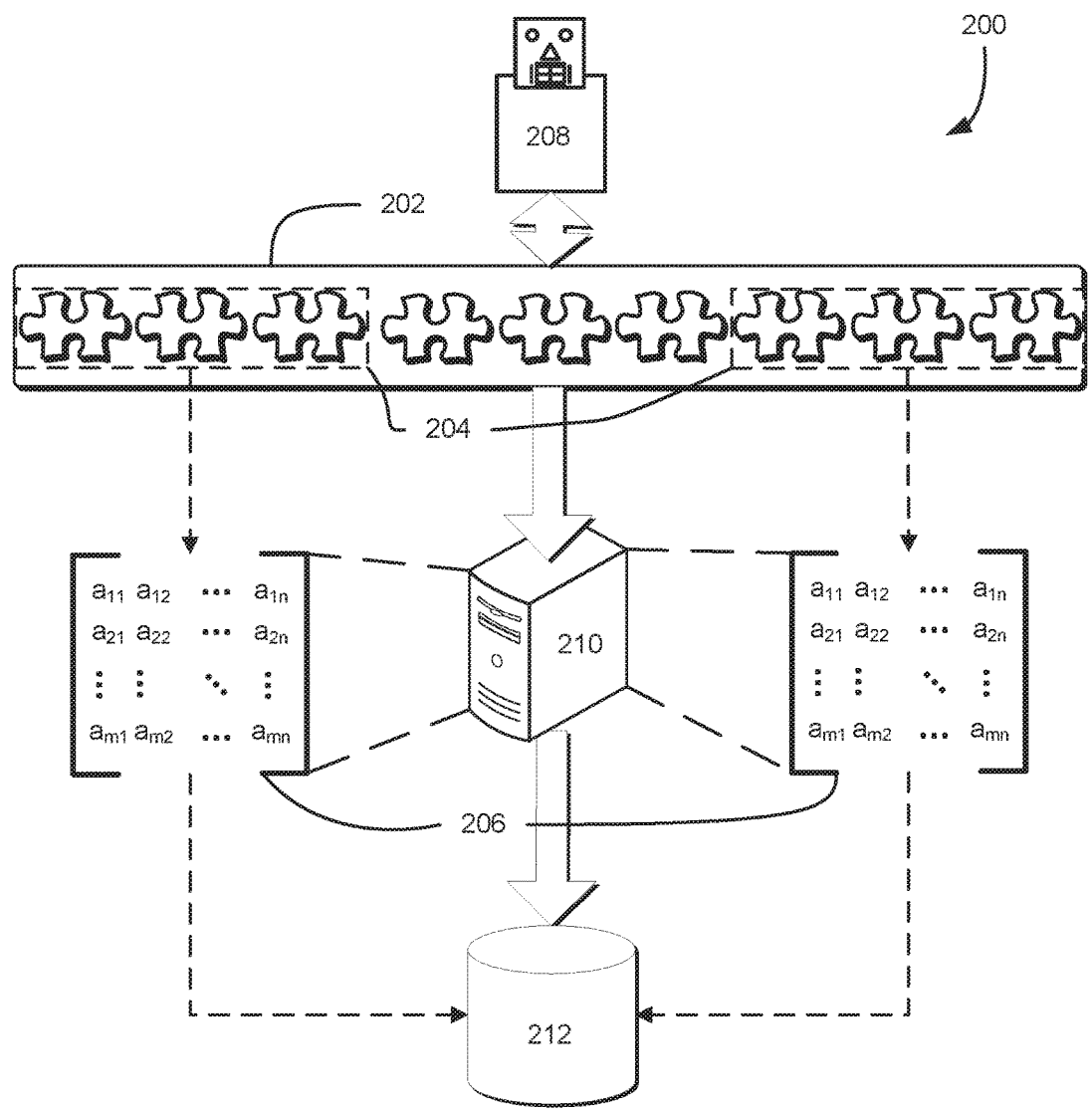
FIG. 2 schematically illustrates various workflows for selecting subsets of redundancy coded data and generating precomputed redundancy coding matrices therefrom, in accordance with some embodiments.

FIG. 2 schematically illustrates various workflows for selecting subsets of redundancy coded data and generating precomputed redundancy coding matrices therefrom, in accordance with some embodiments. Similarly to previously mentioned, a set of shards 202 (which may be similar to shard set 102 described in connection with FIG. 1) corresponds to data of one or more archives is stored on or in connection with a data storage device or data storage system (e.g., 210) implementing a redundancy code, in accordance with some embodiments. The shards may correspond to data received from, e.g., client entities (such as those associated with a customer of a computing resource service provider as described in further detail herein), for encoding and storage on or in connection with the data storage system 210.

The shard set 202, as mentioned, may represent a redundancy-coded form of data corresponding to one or more archives. The redundancy code may be applied, e.g., by a data storage system as described herein. The original data of the archives may be encoded using the redundancy code so as to generate a quantity of shards in the set according to the specific redundancy code utilized, the parameters of the selected redundancy code, and/or desired characteristics for the stored data (e.g., level of durability, availability, performance, redundancy, and the like).

One or more regeneration sets 204, which may be similar to regeneration sets 104 described above in connection with FIG. 1, each associated with a subset of the shard set 202, are selected by, e.g., the data storage system 210, for further processing in accordance with techniques discussed in further detail herein. As mentioned, the regeneration sets 204 may be selected such that each regeneration set 204 includes a number of shards of the shard set 202 corresponding a minimum quorum of such shards required reconstruct the original data of the archive(s)/data represented therewith. A plurality of regeneration sets 202 may be selected, such that every shard of the shard set 202 is capable of being regenerated using at least one of the regeneration sets 202.

To facilitate this process, matrices 206, which in some embodiments may be similar to the matrices 106 described above in connection with FIG. 1, may be precomputed by the data storage system 210 from the respective regeneration sets 204. As mentioned, such matrices 206 may be precomputed to be specific to the respective regeneration sets 204, such that they may be stored, e.g., on a data store 212 by the data storage system 210, for future retrieval. The data store 212 may be similar to the data store 108 described above in connection with FIG. 1. Also as previously discussed, the matrices 206 may be the matrix inverse of the calculated (e.g., generator) matrix for the specific quorum of shards in the associated regeneration set 206 (e.g., a submatrix of the generator matrix specific to the member shards of a given regeneration set with columns irrelevant to the regeneration set removed from the generator matrix).

As previously discussed, as the number of shards in the shard set 202 and the size of the minimum quorum increases, the computational requirements for generating the matrices 206 may greatly increase (and, in many cases, may be greater than further calculations necessary to regenerate the original data and/or encode a replacement shard therefrom). As a result, precomputing such regeneration information (e.g., determining the regeneration sets 202 and computing the matrices 206) prior to an event when such regeneration is necessitated may decrease the amount of time and system load required to generate replacement shards for those that become unavailable. In some embodiments, an application 208 or other requester of the archives associated with the shard set 202 may cause the data storage system 210 (or similar entity) to initiate the precomputation of the regeneration information. In certain embodiments, at the initialization of the application 208 (e.g., at compile time of the application 208), the application or user/builder thereof may request that the data storage system precompute the regeneration information so as to improve the availability of the requested data over time. In some embodiments, the data storage system may automatically perform such precomputation in connection with detecting a request for the data, e.g., by application 208.

In some embodiments, the data storage system 210 may perform the aforementioned precomputation in connection with one or more events that are determined (e.g., by the data storage system 210 or an administrator thereof) to cause an increased risk of data loss or data unavailability, such that if additional events (e.g., correlated failures) occur, shards that become unavailable as a result of such additional events may be more quickly replaced. For example, a shard set 202 may be distributed across a plurality of disparate data centers, and if one of the data centers becomes temporarily (or permanently) unavailable, based on the specific redundancy code parameters used to encode the shards of the shard set 202, the shard set 202 may no longer have the intended safety margin above the minimum quorum of shards necessary to regenerate the original data. In such a scenario, based on the parameters of the implemented redundancy code (e.g., minimum regeneration quorum, number of available shards, time and resources necessary to compute the matrices 306), the data storage system 210 may perform the precomputation mentioned as, e.g., a safety measure, so as to improve availability and durability of the data (and thus, serve applications 208 or other requesters with less interruption of service).

The illustrated example depicts a shard set 202 of nine shards, and may have a minimum regeneration quorum of three shards. By way of example, the nine shards may be evenly distributed across three data centers. If one of the data centers becomes unavailable, the data storage system 210 may determine that of the six remaining shards, two non-overlapping regeneration sets 202 should have matrices 206 precomputed and cached/stored on data store 212. In such a scenario, any one additional shard of the remaining six may become unavailable and still benefit from a quick rebuild using one of the precomputed matrices 206 and regeneration sets 202, thereby improving time-to-recovery and availability of the data represented by the overall shard set 202 while the data center is unavailable, relative to if no such precomputation was executed.

Figure 3:
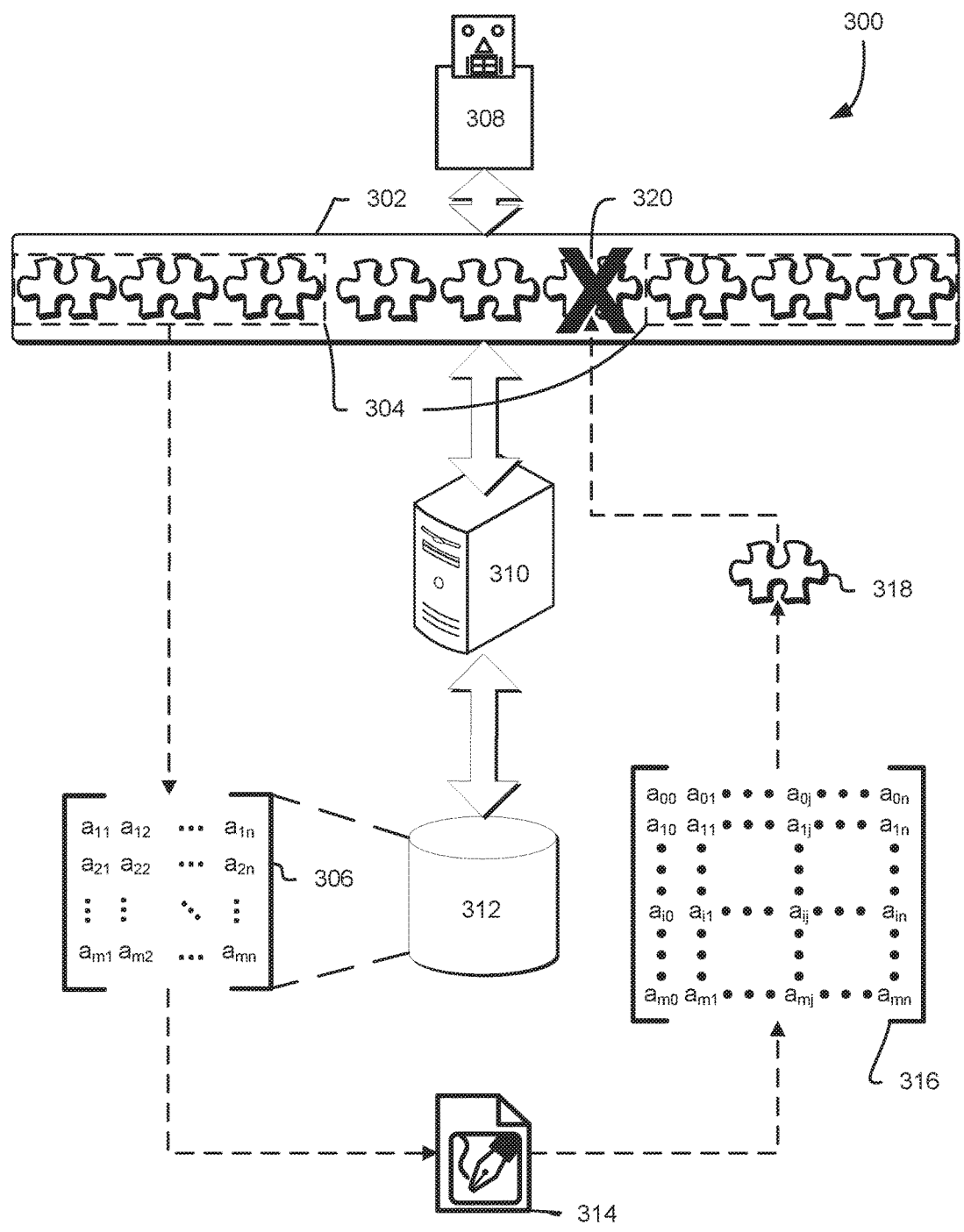
FIG. 3 schematically illustrates various workflows for regenerating unavailable redundancy coded data using precomputed redundancy coding matrices, in accordance with some embodiments.

FIG. 3 schematically illustrates various workflows for regenerating unavailable redundancy coded data using precomputed redundancy coding matrices, in accordance with some embodiments. In some embodiments, one or more regeneration sets 304 may be determined from and for a shard set 302, and one or more matrices 306 may be generated therefrom, e.g., by a data storage system 310, in accordance with techniques similar to that described above in connection with at least FIGS. 1 and 2. Such regeneration information may, as previously discussed in connection with FIGS. 1 and 2, be stored on a data store 312, for future retrieval, and such techniques may be implemented in connection with some adverse event, such as the detection of a failure pattern of the shards (e.g., the loss of a predetermined quantity of shards or a count of remaining available shards dropping below a given level, such as the minimum regeneration quorum or some quantity above that minimum level), or in connection with an application or other requester of the archives (e.g., at time of initialization of the requesting application).

In some embodiments, failure patterns may be predetermined, e.g., prior to failure occurring, in connection with determining (using, e.g., Markov chain analysis of various components, whether software, hardware, or both) failure correlation between known components, as well as their respective individual and/or combined expected failure rate (e.g., annualized failure rate). In such scenarios, the failure patterns may include one or more models of components that may have correlated failure modes, and redundancy coding matrices used by the techniques described herein may be precomputed therefrom. Non-limiting examples of components which may be accounted for and correlated (and/or correlatable) in a given failure pattern may include physical hardware (e.g., storage devices, hosts, servers, data centers, networks, and the like), software (e.g., so as to account for bugs and other deficiencies), and the like.

In the event that a shard of the shard set 302 is detected by, e.g., the data storage system 310 or a requestor/application 308, as unavailable (e.g., 320), a system, such as the data storage system determines one or more of the precomputed regeneration sets 304 that is both still whole (e.g., having all shards therein available) and capable of generating a replacement shard 318 for the unavailable shard 320. In some embodiments, a regeneration set is capable of generating a replacement shard 318 simply by virtue of having a requisite quorum of shards available to rebuild the original data of the archive represented in the shard set 302.

At a time after determining an appropriate regeneration set 302, the corresponding matrices 306 are retrieved, e.g., from the data store 312, and the shards in the regeneration set 302 are used together with such matrices to regenerate the original data 314. The original data may, in some embodiments, be verified against information corresponding to the original data as originally stored (e.g., using checksums, hash values, or other verification information), and, in certain embodiments, may be cached in a data store similar to or different from the data store 312. A redundancy code matrix 316, such as a generator matrix, which may be similar to or a portion of the redundancy code matrix used to originally encode the original data into the shards of the shard set 302, is used to encode the original data 314 to generate a replacement shard 318.

In some embodiments, the replacement shard 318 is identical to the unavailable shard 320 it is intended to replace. In some of such embodiments, the redundancy code matrix is implemented such that a specific value, such as a shard (e.g., matrix) index corresponding to the index of the originally generated (and now unavailable) shard, 320, is used. In certain embodiments, each shard of the shard set 302 may have fixed, or static, matrix/shard index values, relative to their logical or physical location within the shard set or across the data storage system or other devices used to store them. The use of such "sticky" shard index values may further improve the time-to-recovery, availability, and generation/regeneration efficiency of shards and/or archives. For example, if the shard indices used to generate the shards of the shard set 302 are fixed, lesser or no recomputation of the regeneration information may be necessitated by, e.g., the replacement of an unavailable shard 320, given that the replacement shard 318 is generated using the same shard index.

Figure 4:
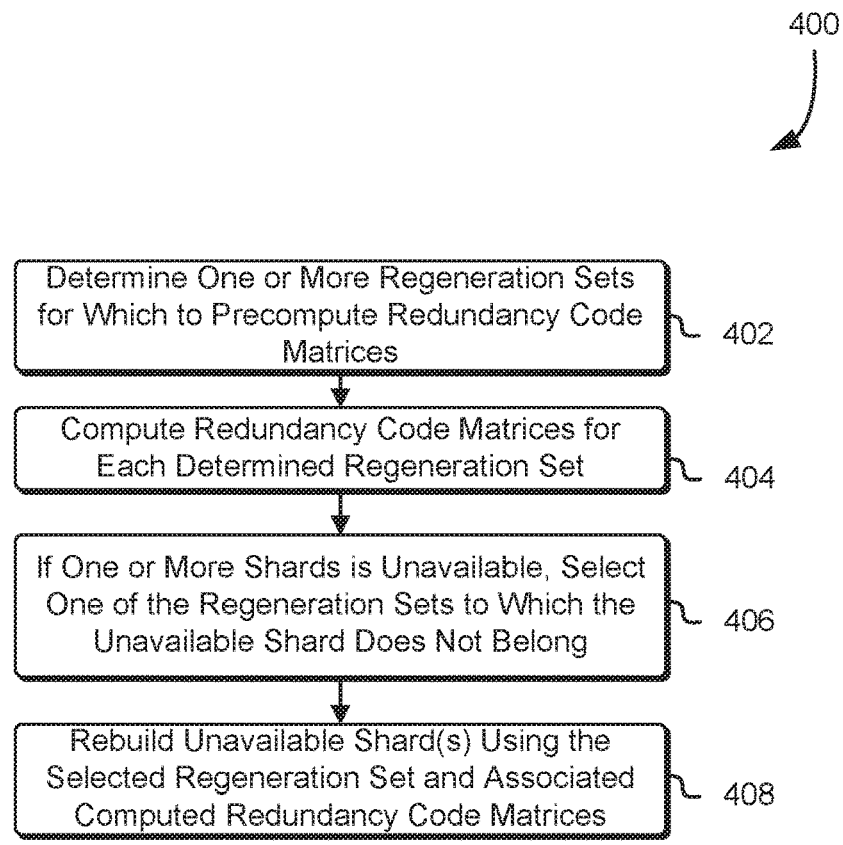
FIG. 4 schematically illustrates an example process for precomputing redundancy coding matrices and restoring unavailable shards therefrom, in accordance with some embodiments.

FIG. 4 schematically illustrates an example process for precomputing redundancy coding matrices and restoring unavailable shards therefrom, in accordance with some embodiments. At step 402, one or more regeneration sets are determined, such as by a data storage system or implementing computing resource service provider as described in further detail herein, for an encoded shard set in connection with one or more parameters of an implemented redundancy code. The techniques described may be similar to those described above in connection with FIGS. 1-3. For example, a quantity and configuration of regeneration sets may be determined such that each shard of the shard set may be regenerable by at least one of the regeneration sets.

At step 404, redundancy code matrices are generated, such as by a data storage system, for each regeneration set determined in step 402. In some embodiments, the matrices may be stored, persistently or transiently, in a data store, such as a data store described in connection with at least FIGS. 1-3 above, for future retrieval and/or use. As previously discussed, the matrices may be inverted portions of a generator matrix used to encode the shards in the first instance. Such computation (and, optionally, storage), may occur at a time prior to an event necessitating regeneration.

At step 406, at a time after a shard is detected as unavailable (e.g., by a requesting application or a data storage system), an appropriate regeneration set as determined at step 402 is selected, e.g., by the data storage system, in accordance with one or more techniques discussed in connection with FIGS. 1-3 above. For example, a regeneration set to which the unavailable shard does not belong may be selected to generate a replacement shard for the unavailable shard.

At step 408, the regeneration set selected in step 406 is used along with the associated redundancy code matrices, e.g., by the data storage system, to rebuild a replacement shard for the unavailable shard. In some embodiments, the replacement shard may be identical (e.g., derived using the same shard index) to the unavailable shard it replaces. As previously discussed in connection with at least FIGS. 1-3, the original data of the archives represented by the shard set may first be regenerated as an interstitial step prior to being reencoded to generate the replacement shard.

Figure 5:
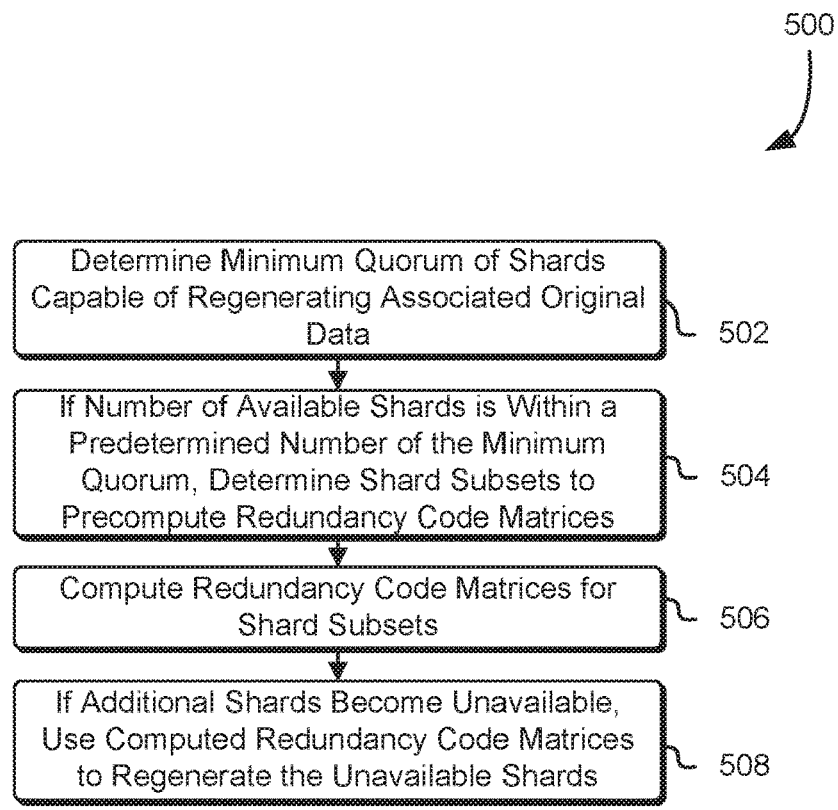
FIG. 5 schematically illustrates an example process for precomputing redundancy coding matrices for remaining shards when the number of available shards drops to a predetermined level, in accordance with some embodiments.

FIG. 5 schematically illustrates an example process for precomputing redundancy coding matrices for remaining shards when the number of available shards drops to a predetermined level, in accordance with some embodiments. At step 502, a data storage system or other entity monitoring and/or implementing redundancy coded storage of data determines a minimum quorum of shards capable of regenerating the original data of a given set of shards representing that original data. Similarly to that which is described above in connection with at least FIGS. 1-3, a predetermined level or failure pattern in connection with the minimum quorum quantity may also be determined. For example, the predetermined level may include a certain quantity of shards greater than the minimum quorum, so as to provide a level of safety for an implementing data storage system.

At step 504, if the data storage system or monitoring entity associated therewith detects that the number of available shards in the shard set drops to or below the predetermined level determined in connection with step 502, precomputation of regeneration information, such as that described in above in connection with FIGS. 1-4, is initiated by the data storage system and/or monitoring entity by determining the possible quantity and configuration of shard subsets capable of regenerating some or all shards among the remaining shards in the shard set (e.g., regeneration sets as described above in connection with at least FIGS. 1-4). At step 506, the data storage system and/or monitoring entity computes the redundancy code matrices for the shard subsets determined in step 504, in a similar fashion as described above in connection with FIGS. 1-4. As previously mentioned, such regeneration information (e.g., the output of steps 504 and/or 506) may be persisted or transiently stored, such as on a data store.

At step 508, if additional shards become available, the regeneration information determined and computed in steps 504 and 506 (and described in greater detail in connection with FIGS. 1-4) are used, e.g., by the data storage system and/or the monitoring entity, to generate one or more replacement shards for the shards detected as unavailable. As previously discussed, in some embodiments, the replacement shards may be identical to the shards they replace.

Figure 6:
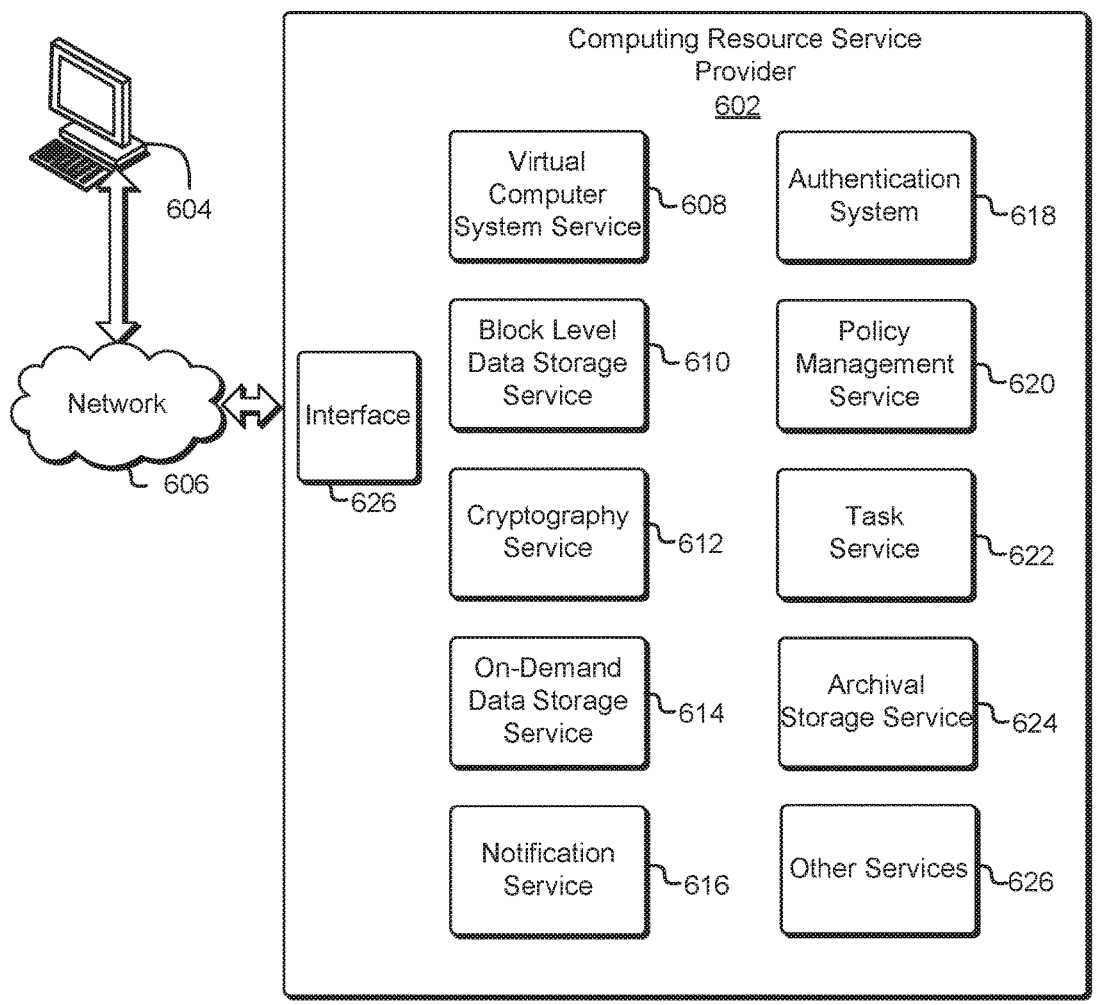
FIG. 6 schematically illustrates an environment, including a computing resource service provider, in which data storage and indexing techniques may be implemented, in accordance with some embodiments.

FIG. 6 shows an example of a customer connected to a computing resource service provider in accordance with at least one embodiment. The computing resource service provider 602 may provide a variety of services to the customer 604 and the customer 604 may communicate with the computing resource service provider 602 via an interface 626, which may be a web services interface or any other type of customer interface. While FIG. 6 shows one interface 626 for the services of the computing resource service provider 602, each service may have its own interface and, generally, subsets of the services may have corresponding interfaces in addition to or as an alternative to the interface 626. The customer 604 may be an organization that may utilize one or more of the services provided by the computing resource service provider 602 to maintain and deliver information to its employees, which may be located in various geographical locations. Additionally, the customer 604 may be an individual that utilizes the services of the computing resource service provider 602 to deliver content to a working group located remotely. As shown in FIG. 6, the customer 604 may communicate with the computing resource service provider 602 through a network 606, whereby the network 606 may be a communication network, such as the Internet, an intranet or an Internet service provider (ISP) network. Some communications from the customer 604 to the computing resource service provider 602 may cause the computing resource service provider 602 to operate in accordance with one or more embodiments described or a variation thereof.

The computing resource service provider 602 may provide various computing resource services to its customers. The services provided by the computing resource service provider 602, in this example, include a virtual computer system service 608, a block-level data storage service 610, a cryptography service 612, an on-demand data storage service 614, a notification service 616, an authentication system 618, a policy management service 620, a task service 622 and one or more other services 624. It is noted that not all embodiments described include the services 608-624 described with reference to FIG. 6 and additional services may be provided in addition to or as an alternative to services explicitly described. As described, each of the services 608-624 may include one or more web service interfaces that enable the customer 604 to submit appropriately configured API calls to the various services through web service requests. In addition, each of the services may include one or more service interfaces that enable the services to access each other (e.g., to enable a virtual computer system of the virtual computer system service 608 to store data in or retrieve data from the on-demand data storage service 614 and/or to access one or more block-level data storage devices provided by the block level data storage service 610).

The virtual computer system service 608 may be a collection of computing resources configured to instantiate virtual machine instances on behalf of the customer 604. The customer 604 may interact with the virtual computer system service 608 (via appropriately configured and authenticated API calls) to provision and operate virtual computer systems that are instantiated on physical computing devices hosted and operated by the computing resource service provider 602. The virtual computer systems may be used for various purposes, such as to operate as servers supporting a website, to operate business applications or, generally, to serve as computing power for the customer. Other applications for the virtual computer systems may be to support database applications, electronic commerce applications, business applications, and/or other applications. Although the virtual computer system service 608 is shown in FIG. 6, any other computer system or computer system service may be utilized in the computing resource service provider 602, such as a computer system or computer system service that does not employ virtualization or instantiation and instead provisions computing resources on dedicated or shared computers/servers and/or other physical devices.

The block-level data storage service 610 may comprise one or more computing resources that collectively operate to store data for a customer 604 using block-level storage devices (and/or virtualizations thereof). The block-level storage devices of the block-level data storage service 610 may, for instance, be operationally attached to virtual computer systems provided by the virtual computer system service 608 to serve as logical units (e.g., virtual drives) for the computer systems. A block-level storage device may enable the persistent storage of data used/generated by a corresponding virtual computer system where the virtual computer system service 608 may only provide ephemeral data storage.

The computing resource service provider 602 also includes a cryptography service 612. The cryptography service 612 may utilize one or more storage services of the computing resource service provider 602 to store keys of the customers in encrypted form, whereby the keys may be usable to decrypt customer 612 keys accessible only to particular devices of the cryptography service 612.

The computing resource service provider 602 further includes an on-demand data storage service 614. The on-demand data storage service 614 may be a collection of computing resources configured to synchronously process requests to store and/or access data. The on-demand data storage service 614 may operate using computing resources (e.g., databases) that enable the on-demand data storage service 614 to locate and retrieve data quickly, to allow data to be provided in responses to requests for the data. For example, the on-demand data storage service 614 may maintain stored data in a manner such that, when a request for a data object is retrieved, the data object can be provided (or streaming of the data object can be initiated) in a response to the request. As noted, data stored in the on-demand data storage service 614 may be organized into data objects. The data objects may have arbitrary sizes except, perhaps, for certain constraints on size. Thus, the on-demand data storage service 614 may store numerous data objects of varying sizes. The on-demand data storage service 614 may operate as a key value store that associates data objects with identifiers of the data objects that may be used by the customer 604 to retrieve or perform other operations in connection with the data objects stored by the on-demand data storage service 614.

In the environment illustrated in FIG. 6, a notification service 616 is included. The notification service 616 may comprise a collection of computing resources collectively configured to provide a web service or other interface and browser-based management console. The management console can be used to configure topics for which customers seek to receive notifications, configure applications (or people), subscribe clients to the topics, publish messages, or configure delivery of the messages over clients' protocol of choice (i.e., hypertext transfer protocol (HTTP), e-mail and short message service (SMS), among others). The notification service 616 may provide notifications to clients using a "push" mechanism without the need to check periodically or "poll" for new information and updates. The notification service 616 may further be used for various purposes such as monitoring applications executing in the virtual computer system service 608, workflow systems, time-sensitive information updates, mobile applications, and many others.

As illustrated in FIG. 6, the computing resource service provider 602, in various embodiments, includes an authentication system 618 and a policy management service 620. The authentication system 618, in an embodiment, is a computer system (i.e., collection of computing resources) configured to perform operations involved in authentication of users of the customer. For instance, one of the services 608-616 and 620-624 may provide information from a user to the authentication system 618 to receive information in return that indicates whether the user requests are authentic.

The policy management service 620, in an embodiment, is a computer system configured to manage policies on behalf of customers (such as customer 604) of the computing resource service provider 602. The policy management service 620 may include an interface that enables customers to submit requests related to the management of policy. Such requests may, for instance, be requests to add, delete, change, or otherwise modify policy for a customer or for other administrative actions, such as providing an inventory of existing policies and the like.

The computing resource service provider 602, in various embodiments, is also equipped with a task service 622. The task service 622 is configured to receive a task package from the customer 604 and enable executing tasks as dictated by the task package. The task service 622 may be configured to use any resource of the computing resource service provider 602, such as one or more instantiated virtual machines or virtual hosts, for executing the task. The task service 624 may configure the one or more instantiated virtual machines or virtual hosts to operate using a selected operating system and/or a selected execution application in accordance with a requirement of the customer 604.

The computing resource service provider 602 additionally maintains one or more other services 624 based at least in part on the needs of its customers 604. For instance, the computing resource service provider 602 may maintain a database service for its customers 604. A database service may be a collection of computing resources that collectively operate to run one or more databases for one or more customers 604. The customer 604 may operate and manage a database from the database service by utilizing appropriately configured API calls. This, in turn, may allow a customer 604 to maintain and potentially scale the operations in the database. Other services include, but are not limited to, object-level archival data storage services, services that manage and/or monitor other services.

The computing resource service provider 602 further includes an archival storage service 624. The archival storage service 624 may comprise a collection of computing resources that collectively operate to provide storage for data archiving and backup of customer data. The data may comprise one or more data files that may be combined to form an archive. The archival storage service 624 may be configured to persistently store data that may be infrequently accessed and for which long retrieval times are acceptable to a customer utilizing the archival storage service 624. A customer may interact with the archival storage service 624 (for example, through appropriately configured API calls made to the archival storage service 624) to generate one or more archives, upload and retrieve the one or more archives or monitor the generation, upload or retrieval of the one or more archives.

The computing resource service provider 602 additionally maintains one or more other services 626 based at least in part on the needs of its customers 604. For instance, the computing resource service provider 602 may maintain a database service for its customers 604. A database service may be a collection of computing resources that collectively operate to run one or more databases for one or more customers 604. The customer 604 may operate and manage a database from the database service by utilizing appropriately configured API calls. This, in turn, may allow a customer 604 to maintain and potentially scale the operations in the database. Other services include, but are not limited to, object-level archival data storage services, services that manage and/or monitor other services.

Figure 7:
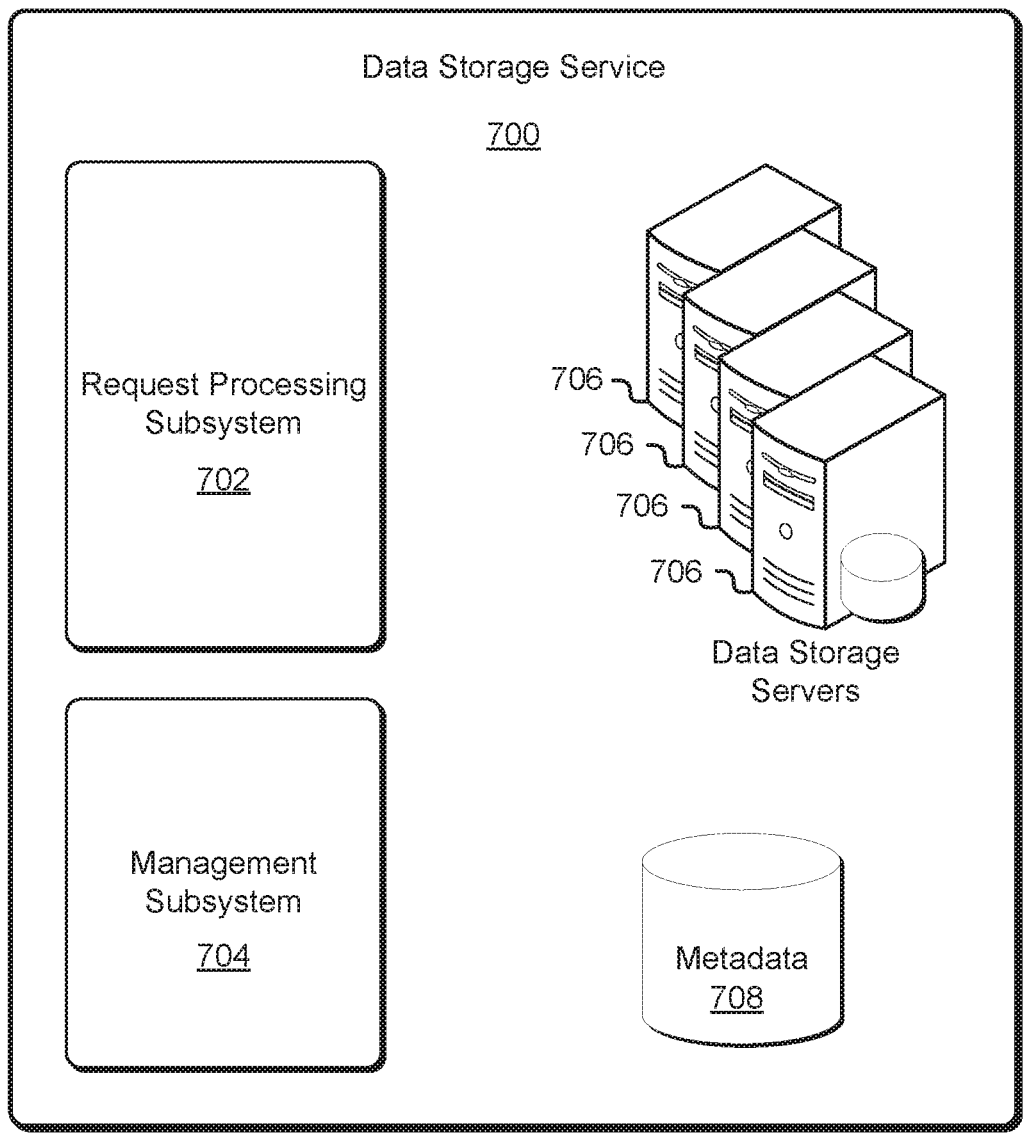
FIG. 7 schematically illustrates a data storage service capable of implementing various data storage and indexing techniques, in accordance with some embodiments.

FIG. 7 shows an illustrative example of a data storage service in accordance with various embodiments. The data storage service 700 may be a service of a computing resource provider used to operate an on-demand data storage service such as described above in connection with FIG. 6. As illustrated in FIG. 7, the data storage service 700 includes various subsystems such as a request processing subsystem 702 and a management subsystem 704. The data storage service 700 may also include a plurality of data storage servers 706 and a metadata storage 708, which may store metadata about various data objects stored among the data storage servers 706 as described. In an embodiment, the request processing subsystem 702 is a collection of computing resources, such as webservers and application servers, collectively configured to process requests submitted to the data storage service 700. The request processing subsystem 702, for example, may include one or more webservers that provide a web service interface to enable customers of the data storage service 700 to submit requests to be processed by the data storage service 700. The request processing subsystem 702 may include computers systems configured to make various determinations in connection with the processing of requests, such as whether policy allows fulfillment of a request, whether requests are authentic (e.g., electronically signed using a suitable cryptographic key) and otherwise.

Components of the request processing subsystem may interact with other components of the data storage service 700 (e.g., through network communications). For example, some requests submitted to the request processing subsystem 702 may involve the management of computing resources which may include data objects stored by the data storage servers 706. The request processing subsystem 702, for example, may receive and process requests to modify computing resources. For instance, in some examples, data objects are logically organized into logical data containers. Data objects associated with a logical data container may, for example, be said to be in the logical data container. Requests to the data processing subsystem 702 may include requests for creating logical data containers, deleting logical data containers, providing an inventory of a logical data container, providing or updating access control policy with respect to one or more logical data containers and the like.

The requests may be processed by the management subsystem 704 upon receipt by the request processing subsystem 702. If applicable, various requests processed by the request processing subsystem 702 and/or management subsystem 704, may result in the management subsystem 704 updating metadata associated with data objects and logical data containers stored in the metadata store 708. Other requests that may be processed by the request processing subsystem 702 include requests to perform operations in connection with data objects. The requests, for example, may include requests to upload data objects to the data storage service 700, to download data objects from the data storage service 700, to delete data objects stored by the data storage service 700 and/or other operations that may be performed.

Requests processed by the request processing subsystem 702 that involve operations on data objects (upload, download, delete, e.g.) may include interaction between the request processing subsystem 702 and one or more data storage servers 706. The data storage servers 706 may be computer system communicatively coupled with one or more storage devices for the persistent of data objects. For example, in order to process a request to upload a data object, the request processing subsystem may transmit data to a data storage server 706 for persistent storage. It is noted, however, that in some embodiments, client (e.g., customer) computer systems may transmit data directly to the data storage servers 706 instead of through severs in the request processing subsystem.

In some embodiments, the request processing subsystem 702 transmits data to multiple data storage servers 706 for the purposes of redundantly storing the data to allow the retrievability of data in the event of failure of an individual data storage server 706 and/or associated data storage device. For example, in some embodiments, the request processing subsystem uses a redundancy in coding scheme such as erasure coding to deconstruct a data object into multiple parts that are stored among the data storage servers 706. The parts may be configured such that if access to a certain number of parts is lost, the data object may nevertheless be reconstructible from the remaining parts that remain accessible.

To enable efficient transfer of data between the request processing subsystem 702 and the data storage servers 706 and/or generally to enable quick processing of requests, the request processing subsystem 702 may include one or more databases that enable the location of data among the data storage servers 706. For example, the request processing subsystem 702 may operate a key value store that serves to associate identifiers of data objects with locations among the data storage servers 706 for accessing data of the data objects.

Figure 8:
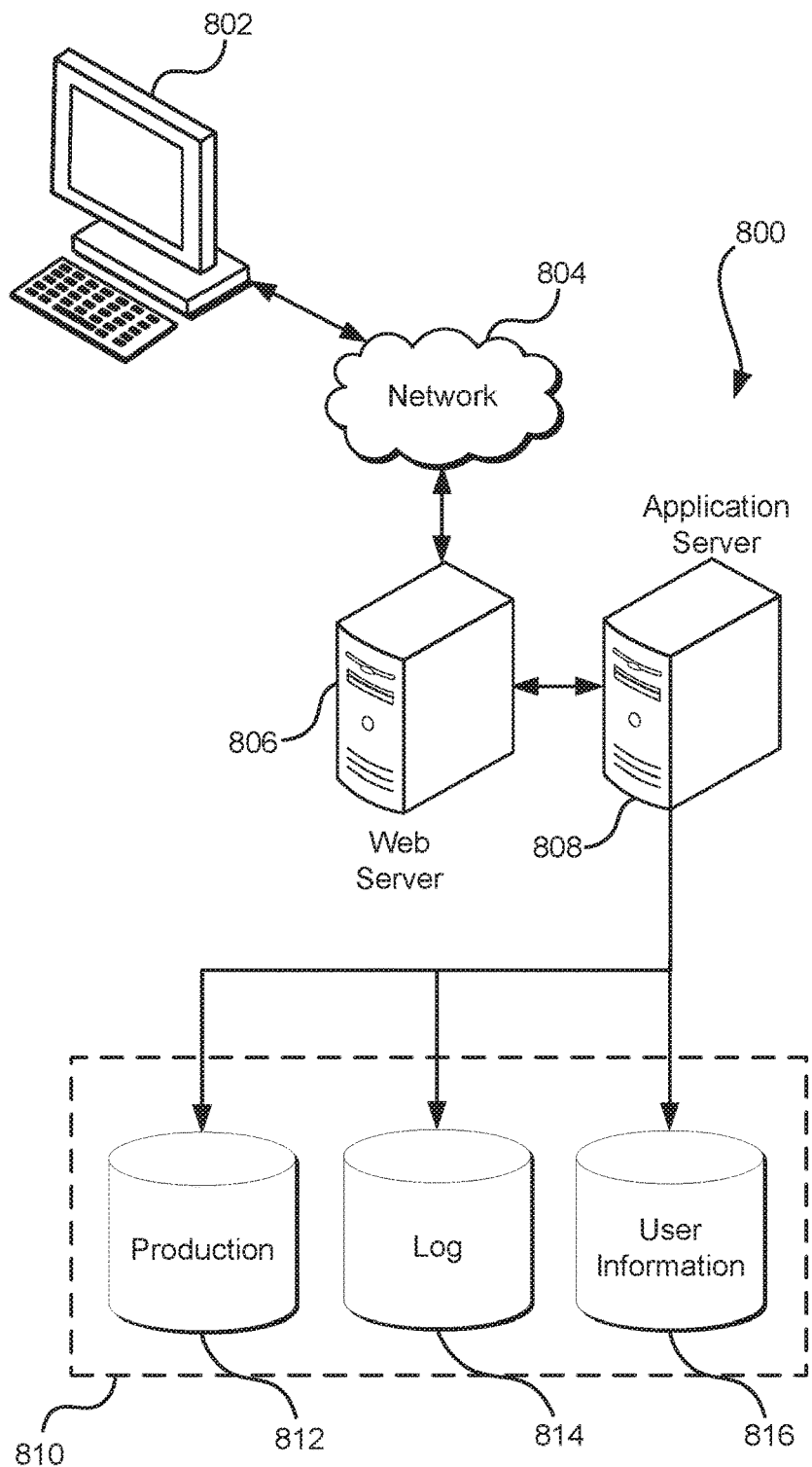
FIG. 8 illustrates an environment in which various embodiments can be implemented.

FIG. 8 illustrates aspects of an example environment 800 for implementing aspects in accordance with various embodiments. As will be appreciated, although a web-based environment is used for purposes of explanation, different environments may be used, as appropriate, to implement various embodiments. The environment includes an electronic client device 802, which can include any appropriate device operable to send and/or receive requests, messages or information over an appropriate network 804 and, in some embodiments, convey information back to a user of the device. Examples of such client devices include personal computers, cell phones, handheld messaging devices, laptop computers, tablet computers, set-top boxes, personal data assistants, embedded computer systems, electronic book readers and the like. The network can include any appropriate network, including an intranet, the Internet, a cellular network, a local area network, a satellite network or any other such network and/or combination thereof. Components used for such a system can depend at least in part upon the type of network and/or environment selected. Protocols and components for communicating via such a network are well known and will not be discussed herein in detail. Communication over the network can be enabled by wired or wireless connections and combinations thereof. In this example, the network includes the Internet, as the environment includes a web server 806 for receiving requests and serving content in response thereto, although for other networks an alternative device serving a similar purpose could be used as would be apparent to one of ordinary skill in the art.

The illustrative environment includes at least one application server 808 and a data store 810. It should be understood that there can be several application servers, layers or other elements, processes or components, which may be chained or otherwise configured, which can interact to perform tasks such as obtaining data from an appropriate data store. Servers, as used herein, may be implemented in various ways, such as hardware devices or virtual computer systems. In some contexts, servers may refer to a programming module being executed on a computer system. As used herein, unless otherwise stated or clear from context, the term "data store" refers to any device or combination of devices capable of storing, accessing and retrieving data, which may include any combination and number of data servers, databases, data storage devices and data storage media, in any standard, distributed, virtual or clustered environment. The application server can include any appropriate hardware, software and firmware for integrating with the data store as needed to execute aspects of one or more applications for the client device, handling some or all of the data access and business logic for an application. The application server may provide access control services in cooperation with the data store and is able to generate content including, but not limited to, text, graphics, audio, video and/or other content usable to be provided to the user, which may be served to the user by the web server in the form of HyperText Markup Language ("HTML"), Extensible Markup Language ("XML"), JavaScript, Cascading Style Sheets ("CSS") or another appropriate client-side structured language. Content transferred to a client device may be processed by the client device to provide the content in one or more forms including, but not limited to, forms that are perceptible to the user audibly, visually and/or through other senses including touch, taste, and/or smell. The handling of all requests and responses, as well as the delivery of content between the client device 802 and the application server 808, can be handled by the web server using PHP: Hypertext Preprocessor ("PHP"), Python, Ruby, Perl, Java, HTML, XML or another appropriate server-side structured language in this example. It should be understood that the web and application servers are not required and are merely example components, as structured code discussed herein can be executed on any appropriate device or host machine as discussed elsewhere herein. Further, operations described herein as being performed by a single device may, unless otherwise clear from context, be performed collectively by multiple devices, which may form a distributed and/or virtual system.

The data store 810 can include several separate data tables, databases, data documents, dynamic data storage schemes and/or other data storage mechanisms and media for storing data relating to a particular aspect of the present disclosure. For example, the data store illustrated may include mechanisms for storing production data 812 and user information 816, which can be used to serve content for the production side. The data store also is shown to include a mechanism for storing log data 814, which can be used for reporting, analysis or other such purposes. It should be understood that there can be many other aspects that may need to be stored in the data store, such as page image information and access rights information, which can be stored in any of the above listed mechanisms as appropriate or in additional mechanisms in the data store 810. The data store 810 is operable, through logic associated therewith, to receive instructions from the application server 808 and obtain, update or otherwise process data in response thereto. The application server 808 may provide static, dynamic or a combination of static and dynamic data in response to the received instructions. Dynamic data, such as data used in web logs (blogs), shopping applications, news services and other such applications may be generated by server-side structured languages as described herein or may be provided by a content management system ("CMS") operating on, or under the control of, the application server. In one example, a user, through a device operated by the user, might submit a search request for a certain type of item. In this case, the data store might access the user information to verify the identity of the user and can access the catalog detail information to obtain information about items of that type. The information then can be returned to the user, such as in a results listing on a web page that the user is able to view via a browser on the user device 802. Information for a particular item of interest can be viewed in a dedicated page or window of the browser. It should be noted, however, that embodiments of the present disclosure are not necessarily limited to the context of web pages, but may be more generally applicable to processing requests in general, where the requests are not necessarily requests for content.

Each server typically will include an operating system that provides executable program instructions for the general administration and operation of that server and typically will include a computer-readable storage medium (e.g., a hard disk, random access memory, read only memory, etc.) storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

The environment, in one embodiment, is a distributed and/or virtual computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 8. Thus, the depiction of the system 800 in FIG. 8 should be taken as being illustrative in nature and not limiting to the scope of the disclosure.

The various embodiments further can be implemented in a wide variety of operating environments, which in some cases can include one or more user computers, computing devices or processing devices which can be used to operate any of a number of applications. User or client devices can include any of a number of general purpose personal computers, such as desktop, laptop or tablet computers running a standard operating system, as well as cellular, wireless and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems and other devices capable of communicating via a network. These devices also can include virtual devices such as virtual machines, hypervisors and other virtual devices capable of communicating via a network.

Various embodiments of the present disclosure utilize at least one network that would be familiar to those skilled in the art for supporting communications using any of a variety of commercially-available protocols, such as Transmission Control Protocol/Internet Protocol ("TCP/IP"), User Datagram Protocol ("UDP"), protocols operating in various layers of the Open System Interconnection ("OSI") model, File Transfer Protocol ("FTP"), Universal Plug and Play ("UpnP"), Network File System ("NFS"), Common Internet File System ("CIFS") and AppleTalk. The network can be, for example, a local area network, a wide-area network, a virtual private network, the Internet, an intranet, an extranet, a public switched telephone network, an infrared network, a wireless network, a satellite network and any combination thereof.

In embodiments utilizing a web server, the web server can run any of a variety of server or mid-tier applications, including Hypertext Transfer Protocol ("HTTP") servers, FTP servers, Common Gateway Interface ("CGI") servers, data servers, Java servers, Apache servers and business application servers. The server(s) also may be capable of executing programs or scripts in response to requests from user devices, such as by executing one or more web applications that may be implemented as one or more scripts or programs written in any programming language, such as Java®, C, C# or C++, or any scripting language, such as Ruby, PHP, Perl, Python or TCL, as well as combinations thereof. The server(s) may also include database servers, including without limitation those commercially available from Oracle®, Microsoft®, Sybase® and IBM® as well as open-source servers such as MySQL, Postgres, SQLite, MongoDB, and any other server capable of storing, retrieving and accessing structured or unstructured data. Database servers may include table-based servers, document-based servers, unstructured servers, relational servers, non-relational servers or combinations of these and/or other database servers.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit ("CPU" or "processor"), at least one input device (e.g., a mouse, keyboard, controller, touch screen or keypad) and at least one output device (e.g., a display device, printer or speaker). Such a system may also include one or more storage devices, such as disk drives, optical storage devices and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired), an infrared communication device, etc.) and working memory as described above. The computer-readable storage media reader can be connected with, or configured to receive, a computer-readable storage medium, representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs, such as a client application or web browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Storage media and computer readable media for containing code, or portions of code, can include any appropriate media known or used in the art, including storage media and communication media, such as, but not limited to, volatile and non-volatile, removable and non-removable media implemented in any method or technology for storage and/or transmission of information such as computer readable instructions, data structures, program modules or other data, including RAM, ROM, Electrically Erasable Programmable Read-Only Memory ("EEPROM"), flash memory or other memory technology, Compact Disc Read-Only Memory ("CD-ROM"), digital versatile disk (DVD) or other optical storage, magnetic cassettes, magnetic tape, magnetic disk storage or other magnetic storage devices or any other medium which can be used to store the desired information and which can be accessed by the system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions and equivalents falling within the spirit and scope of the invention, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including" and "containing" are to be construed as open-ended terms (i.e., meaning "including, but not limited to,") unless otherwise noted. The term "connected," when unmodified and referring to physical connections, is to be construed as partly or wholly contained within, attached to or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. The use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but the subset and the corresponding set may be equal.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in the illustrative example of a set having three members, the conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present.

Operations of processes described herein can be performed in any suitable order unless otherwise indicated herein or otherwise clearly contradicted by context. Processes described herein (or variations and/or combinations thereof) may be performed under the control of one or more computer systems configured with executable instructions and may be implemented as code (e.g., executable instructions, one or more computer programs or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory.

The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

Embodiments of this disclosure are described herein, including the best mode known to the inventors for carrying out the invention. Variations of those embodiments may become apparent to those of ordinary skill in the art upon reading the foregoing description. The inventors expect skilled artisans to employ such variations as appropriate and the inventors intend for embodiments of the present disclosure to be practiced otherwise than as specifically described herein. Accordingly, the scope of the present disclosure includes all modifications and equivalents of the subject matter recited in the claims appended hereto as permitted by applicable law. Moreover, any combination of the above-described elements in all possible variations thereof is encompassed by the scope of the present disclosure unless otherwise indicated herein or otherwise clearly contradicted by context.

All references, including publications, patent applications and patents, cited herein are hereby incorporated by reference to the same extent as if each reference were individually and specifically indicated to be incorporated by reference and were set forth in its entirety herein.

What is claimed is:

1. A computer-implemented method, comprising:
under the control of one or more computer systems configured with executable instructions,
receiving a first request to store an archive;
encoding, using a redundancy code, original data of the archive into a plurality of shards;
determining, from the plurality of shards and the redundancy code, at least one regeneration set, the regeneration set consisting of a subset of the plurality of shards and having a number of members equal to or greater than a minimum quorum of the plurality of shards sufficient to regenerate the original data;
computing one or more matrices for the regeneration set, the one or more matrices capable of being used with the corresponding subset of the plurality of shards to regenerate the original data;
storing the computed matrices and the plurality of shards;
in response to a second request, retrieving a matrix of the stored matrices that corresponds to a regeneration set associated with the second request; and
regenerating one or more shards associated with the second request using the retrieved matrix and the corresponding regeneration set.

2. The computer-implemented method of claim 1, wherein the one or more matrices are computed by inverting at least a portion of a generator matrix used by the redundancy code, the portion corresponding to the regeneration set.

3. The computer-implemented method of claim 1, wherein the determination of the regeneration set, the computation of the matrices, and the storage of the computed matrices occurs in connection with initialization of an application that accesses the archive.

4. The computer-implemented method of claim 1, wherein the second request includes an indication that a shard of the plurality of shards is unavailable.

5. The computer-implemented method of claim 4, wherein the regeneration set associated with the second request excludes the shard that is unavailable.

6. A system, comprising:
one or more processors; and
memory comprising one or more instructions that, as a result of being executed by the one or more processors, cause the system to at least:
receive a request to store an archive;
generate, using a redundancy code, a plurality of shards from original data of the archive;
determine one or more regeneration sets from the plurality of shards, the regeneration sets including a subset of the plurality of shards capable of regenerating the original data;
compute information from the redundancy code and corresponding to the regeneration sets, the computed information being usable to regenerate a replacement shard for at least a subset of the shards in the plurality; and
in response to a second request, use the computed information to regenerate data associated with the second request.

7. The system of claim 6, wherein the instructions, as a result of being executed, further compute the information from the redundancy code by generating matrices from the redundancy code that correspond to a respective regeneration set.

8. The system of claim 7, wherein the instructions, as a result of being executed, further generate the matrices by inverting at least a portion of a generator matrix used by the redundancy code, the portion corresponding to the respective regeneration set.

9. The system of claim 6, wherein the redundancy code is an erasure code.

10. The system of claim 6, wherein the instructions, as a result of being executed, further store, in a data store in communication with the system, the computed information.

11. The system of claim 6, wherein the instructions, as a result of being executed, further determine the one or more regeneration sets in connection with a second request.

12. The system of claim 6, wherein the instructions, as a result of being executed, further determine the one or more regeneration sets and compute the information in connection with receiving a second request.

13. A non-transitory computer-readable storage medium having stored thereon executable instructions that, as a result of being executed by one or more processors of a computer system, cause the computer system to at least:
- receive a first request associated with storing an archive;
- determine one or more regeneration sets from a plurality of redundancy coded shards stored for the archive, each of the regeneration sets having a number of member shards equal to a quorum sufficient to regenerate the archive;
- compute information for each of the regeneration sets that is usable by the computer system to regenerate any of the plurality of redundancy coded shards using the member shards of a respective regeneration set;
- receive a second request associated with one or more unavailable shards of the plurality of redundancy coded shards; and
- use at least a subset of the computed information to generate data to replace the unavailable shards.

14. The non-transitory computer-readable storage medium of claim 13, wherein the instructions, as a result of being executed by the one or more processors, further cause the computer system to determine the one or more regeneration sets such that each shard of the plurality of shards is capable of being regenerated by a respective regeneration set to which it does not belong.

15. The non-transitory computer-readable storage medium of claim 13, wherein the instructions, as a result of being executed by the one or more processors, further cause the computer system to compute the information for each of the regeneration sets based at least in part on one or more parameters of a redundancy code used to generate the shards from the archive.

16. The non-transitory computer-readable storage medium of claim 15, wherein the generated data to replace the unavailable shards includes at least one replacement shard.

17. The non-transitory computer-readable storage medium of claim 13, wherein the instructions, as a result of being executed by the one or more processors, further cause the computer system to store, in a data store associated with the computer system, the computed information for each of the regeneration sets.

18. The non-transitory computer-readable storage medium of claim 13, wherein the instructions, as a result of being executed by the one or more processors, further cause the computer system to determine the one or more regeneration sets and compute the information for each of the regeneration sets in connection with the first request and prior to receiving the second request.

19. The non-transitory computer-readable storage medium of claim 13, wherein the instructions, as a result of being executed by the one or more processors, further cause the computer system to generate the at least one replacement shard by generating original data of the archive.

20. The non-transitory computer-readable storage medium of claim 13, wherein the replacement shards are identical to the unavailable shards being replaced.

* * * * *